United States Patent [19]

Layden

[11] Patent Number: 4,962,891
[45] Date of Patent: Oct. 16, 1990

[54] APPARATUS FOR REMOVING SMALL PARTICLES FROM A SUBSTRATE

[75] Inventor: Lawrence M. Layden, Stanton, N.J.

[73] Assignee: The BOC Group, Inc., New Providence, N.J.

[21] Appl. No.: 280,775

[22] Filed: Dec. 6, 1988

[51] Int. Cl.⁵ ............................................. B05B 1/00
[52] U.S. Cl. ................................. 239/597; 239/590; 51/320; 134/93; 134/198
[58] Field of Search ................. 134/93, 182, 198, 199; 51/320, 439; 239/552, 553.3, 553.5, 555, 590, 590.5, 568, 597; 62/74

[56] References Cited

U.S. PATENT DOCUMENTS

| | | | |
|---|---|---|---|
| 2,985,387 | 5/1961 | Sprang, Jr. | |
| 3,623,437 | 11/1971 | Lusser | 239/568 |
| 3,790,087 | 2/1974 | Banyas et al. | 239/555 |
| 4,806,171 | 2/1989 | Whitlock et al. | 134/93 |

Primary Examiner—Andres Kashnikow
Assistant Examiner—Christopher G. Trainor
Attorney, Agent, or Firm—Robert I. Pearlman; Carol A. Nemetz; David M. Rosenblum

[57] ABSTRACT

Apparatus for removing small particles from a substrate including superimposed plates forming at least two parallel chambers and a film-like member interposed between the plates and adapted to provide flow communication between the chambers to enable fluid carbon dioxide to form a mixture of solid particles and gaseous carbon dioxide which flows out of an ejection port toward the substrate.

20 Claims, 5 Drawing Sheets

4,962,891

APPARATUS FOR REMOVING SMALL PARTICLES FROM A SUBSTRATE

The present invention is directed to apparatus for removing minute particles from a substrate employing a stream containing solid and gaseous carbon dioxide.

BACKGROUND OF THE INVENTION

The Assignee of the present application has a pending application, U.S. Patent Application Ser. No. 116,194 filed on Nov. 3, 1987 which is a continuation-in-part application of U.S. Pat. Application Ser. No. 041,169, filed Apr. 22, 1987 which describes apparatus and methods for removing finely particulate surface contaminants from a substrate such as a semiconductor wafer.

The apparatus, as shown in particular in the drawings, provides for the flow of fluid carbon dioxide into a chamber wherein the fluid is converted to a mixture of gaseous carbon dioxide and fine droplets of carbon dioxide. This mixture is then transported in metered amounts through the use of e.g. needle valve or a restricted orifice to a coalescing chamber where the fine droplets are converted to larger droplets to form a second mixture. The larger droplets are then formed into solid particles as the feed passes from the coalescing chamber through a tubular passageway into a second orifice and out of an exit port. The entire disclosure of U.S. Ser. No. 116,194 is incorporated herein by reference.

The apparatus of the present invention represents an improvement over the apparatus described above in that it is easier to manufacture, provides a more reliable means for metering the mixture and provides for more even distribution of the mixture, especially as it flows into the coalescing chamber. Another benefit of the present invention is that the solid product stream is directed out of the exit port and onto the substrate to provide more uniform cleaning. Cleaning is enhanced by employing an ejection port which has a slit-like shape and may be made of any desired width. The larger the width, the greater the cleaning area per pass.

In accordance with this invention there is provided a novel apparatus for removing small particles from a substrate which provides more effective means of controlling the flow rate of the fluid mixtures and thereby provide a more effective means of removing contaminants from a substrate surface.

SUMMARY OF THE INVENTION

The present invention is generally directed to an apparatus for removing small particles from a substrate comprising:

(a) a source of fluid carbon dioxide under pressure and having an enthalpy of below about 135 BTU per pound based on an enthalpy of zero at 150 psia for a saturated liquid, so that a solid fraction will form upon the expansion of the fluid carbon dioxide to the ambient pressure of the substrate;

(b) a nozzle having a first opening for receiving the fluid carbon dioxide from the source and a second opening for emitting a mixture of solid and gaseous carbon dioxide toward the substrate, said nozzle further comprising, (1) a pair of plates adapted to be superimposed over each other collectively defining a first chamber connected to the first opening and a second chamber spaced apart from the first chamber, (2) a foil-like member interposed between the superimposed plates and comprising a hole aligned with the first opening for providing a pathway for the flow of said fluid into the first chamber, and fine droplets of liquid carbon dioxide, and at least two finger-like projections extending from the first chamber to the second chamber and together with the superimposed plates forming at least one first channel providing flow communication between the fluid forms a first mixture of gaseous carbon dioxide and fine droplets of liquid carbon dioxide in the at least one first channel and wherein the first and second chambers, wherein the first mixture is converted to a second mixture in the second chamber containing gaseous carbon dioxide and larger liquid droplets of carbon dioxide, and (3) a second channel formed by said plates and extending from the second chamber to the second opening enabling the second mixture to expand into said mixture of solid and gaseous carbon dioxide and exit out of the second opening toward the substrate.

More specifically, the present invention employs a thin foil between superimposed plates where the channels formed by the foil in conjunction with the plate surfaces provide a stationary means of metering the flow of carbon dioxide from the first chamber to the second or coalescing chamber. There is also provided a flat widened pathway formed by the superimposed plates for transporting the mixture from the coalescing chamber to the exit port which provides a move uniform flow of product toward the substrate and constitutes a second restricting orifice to maintain the desired pressure in the coalescing chamber.

The following drawings and the embodiments described therein in which like reference characters indicate like parts are illustrative of the present invention and are not meant to limit the scope of the invention as set forth in the claims forming part of the application.

DESCRIPTION OF THE INVENTION

Figure 1:
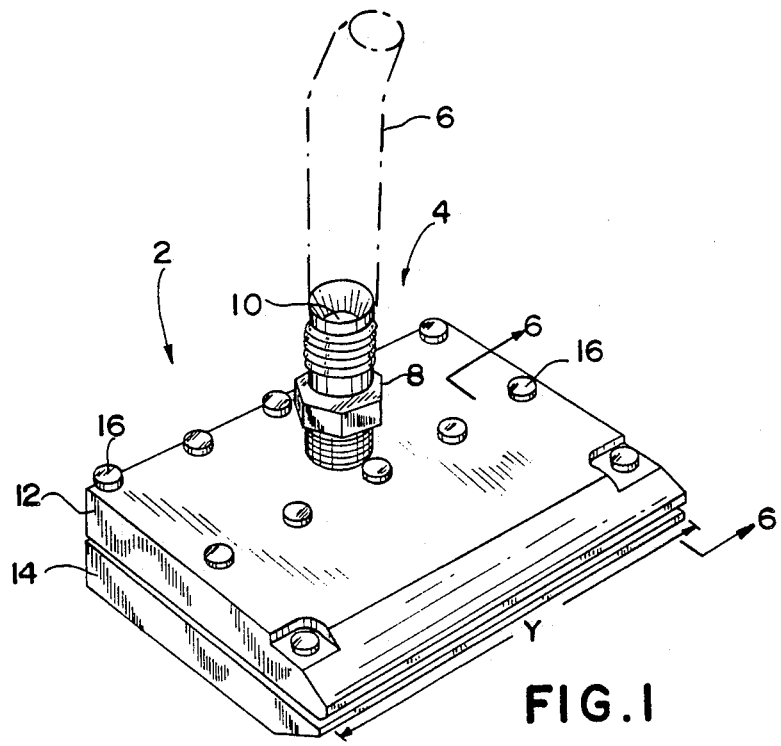
FIG. 1 is a perspective view of the apparatus of the present invention with the superimposable plates operatively secured to each other.
Figure 2:
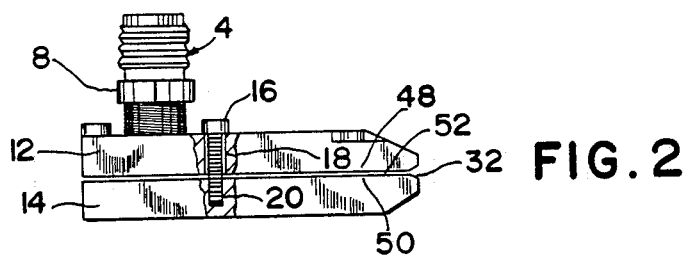
FIG. 2 is a side view with a partial cross-section of the device shown in FIG. 1 showing the plates secured to each other.
Figure 3:
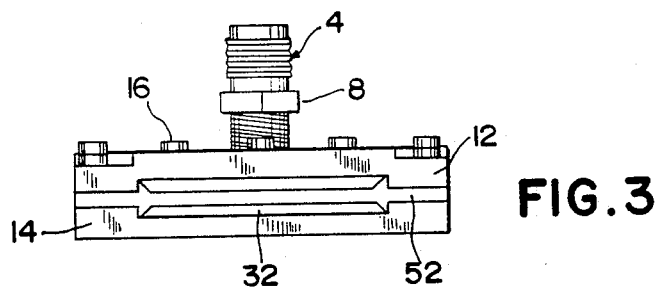
FIG. 3 is a front view of the device shown in FIG. 1 showing the exit port.

Referring to the drawings, and specifically to FIGS. 1-5B the apparatus 2 of the present invention includes a fluid carbon dioxide receiving assembly 4 which is connected to a fluid carbon dioxide storage facility (not shown) via connecting means 6. The connecting means 6 may be a steel reinforced Teflon hose or any other suitable connecting means which enables the fluid carbon dioxide to flow from the source to the receiving assembly 4.

The receiving assembly 4 includes a housing 8 having a hole 10 extending through the housing 8. The assembly 4 is either permanently or removably secured to the apparatus 2 such as by thread and groove engagement.

The apparatus 2 also includes a pair of plates 12, 14 which are of complimentary shape and superimposable one over the other. As shown best in FIGS. 2 and 3, the plates 12 and 14 may be secured to each other by a plurality of evenly distributed screws 16 which are insertable into respective holes 18 and 20 or other suitable securing means.

Figure 4:
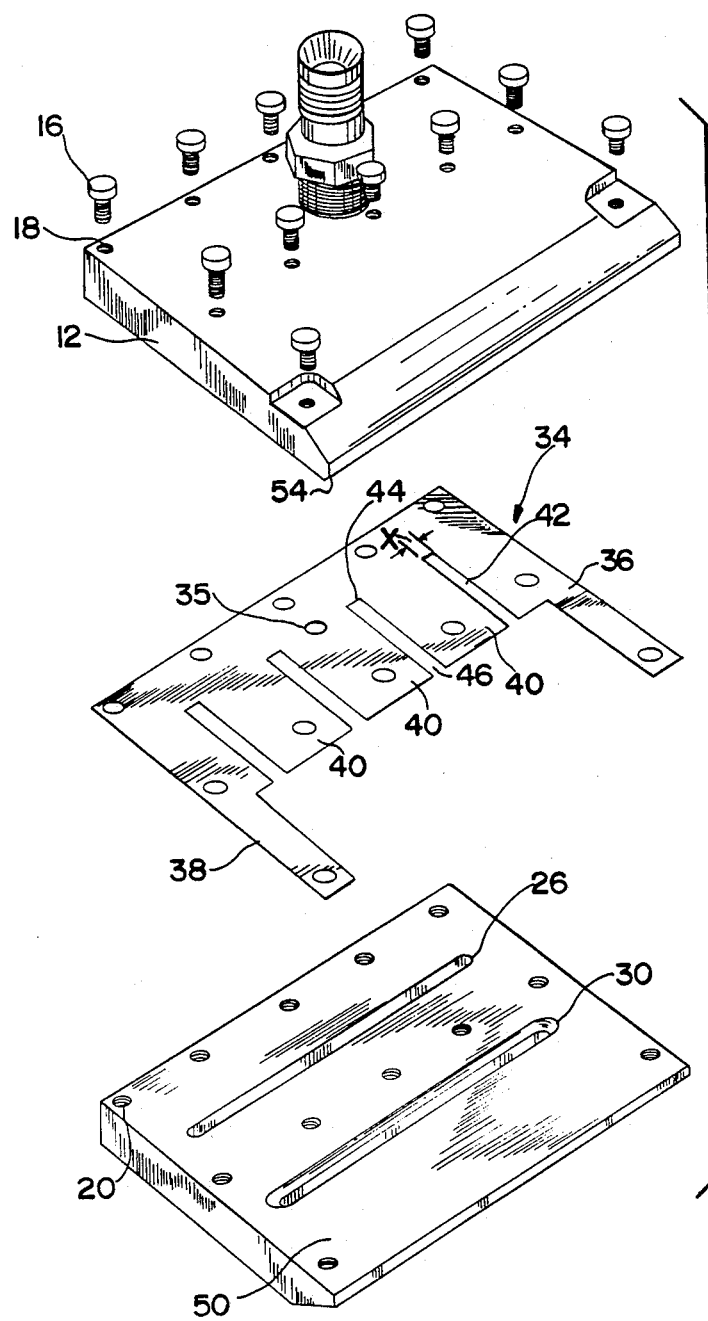
FIG. 4 is a perspective view of the embodiment shown in FIG. 1 showing the film-like member in position between the plates.
Figure 5A:
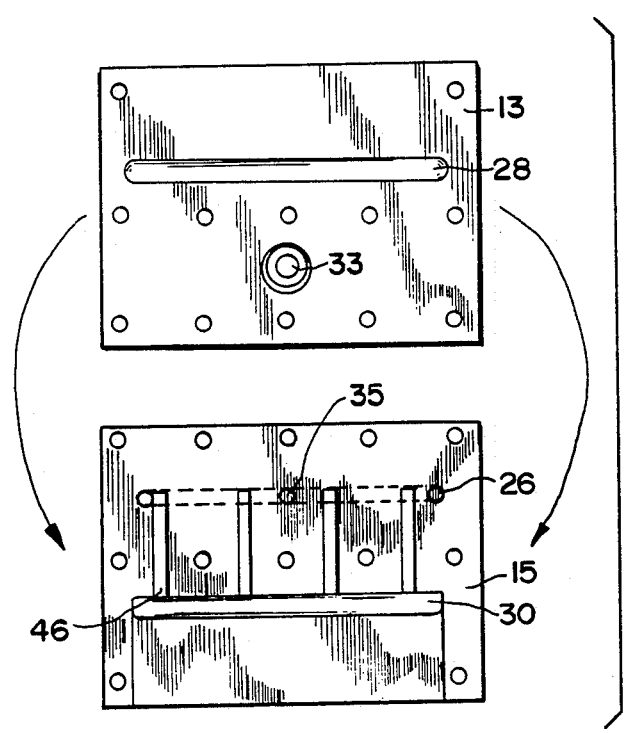
FIG. 5A is a plan view of the plates laid open showing the positioning of the film-like member on the bottom plate with the top plate having a single transverse groove.

As best shown in FIGS. 4 and 5A, one embodiment of the invention provides a transverse groove 28 on the bottom surface 13 of the top plate 12 extending along a substantial width of the top plate. The top surface 15 of the bottom plate 14 is provided with a complimentary transverse groove 30 of like dimension such that when the plates are superimposed they form a symmetrical coalescing chamber for transforming fine droplets of carbon dioxide into larger droplets of carbon dioxide which subsequently solidify and exit out of an ejection port 32 as explained in detail hereinafter.

The bottom plate 14 is also provided with another transverse groove 26 which is rearward of the groove 30 and aligned with a hole 33 in the top plate 12 to provide a passageway for the flow of the fluid carbon dioxide from the source to the groove 26. In the preferred embodiment shown in FIG. 5A, the top plate does not have a groove complimentary to the groove 26. When the flat bottom surface 13 of the top plate 12 is superimposed over the groove 26 of the bottom plate 14 there is formed an asymmetrical carbon dioxide fluid receiving chamber.

Figure 5B:
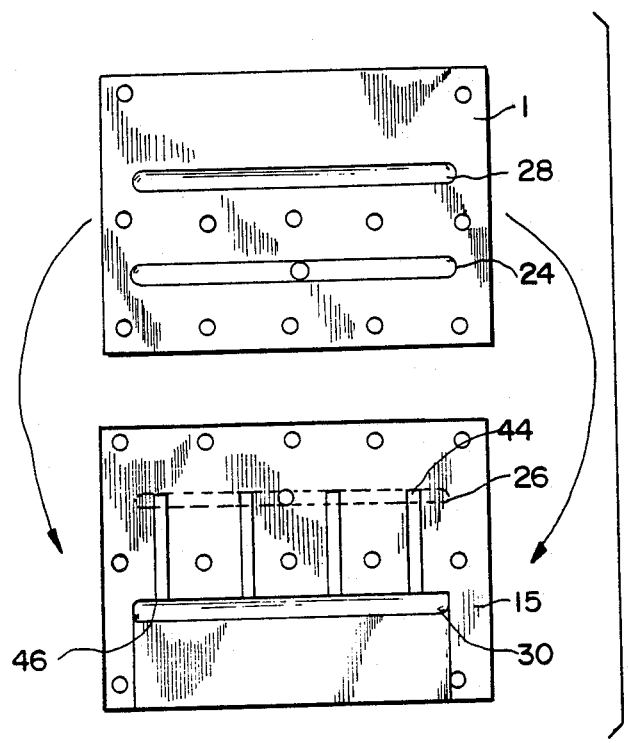
FIG. 5B is a plan view of the laid open plates similar to FIG. 5A with the top plate having two transverse grooves.

An alternative embodiment is shown in FIGURE 5B wherein the top plate is provided with a transverse groove 24 which is complimentary in shape to the groove 26 in the bottom plate 14. When the respective plates 12, 14 are superimposed, grooves 24 and 26 from a symmetrial carbon dioxide fluid receiving chamber.

A symmetrical coalescing chamber is preferred in order to achieve maximum uniform distribution of the solid particles of carbon dioxide as they are formed in the chamber and evacuated through the ejection port 32. On the other hand, the fluid receiving chamber need not be symmetrical since the incoming fluid is inherently evenly distributed. It is preferred to form the top plate without the groove 24 in order to minimize manufacturing costs.

Interposed between the plates 12 and 14 is a film like member 34 which provides a fixed means of metering the carbon dioxide mixture from the first chamber to the second chamber.

As shown best in FIG. 4, the film-like member 34 includes opposed arms 36 and 38 which run along opposed sides of the plates 12 and 14. There is also provided at least two projections or fingers 40. Adjacent fingers 40 are separated from each other by a distance "x" to thereby define at least one channel 42. One end 44 of the channel 42 is in flow communication with the first chamber as shown best in FIGS. 5A and 5B and the other end 46 is in flow communication with the second chamber to thereby provide a passageway for the flow of carbon dioxide from the first to the second chamber. The film-like member 34 is also provided with an opening 35 which mates with the hole 10 to provide a continuous passageway for the flow of the fluid carbon dioxide from the source to the first chamber.

The respective forward portions 48 and 50 of the superimposed plates 12, 14 define an orifice 52 in which the larger droplets of carbon dioxide expand and form solid particles prior to exiting through the ejection port 32.

Figure 6:
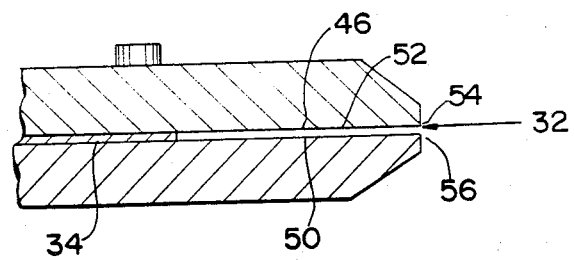
FIG. 6 is a partial side view taken along line 6—6 of FIG. 1.

The ejection port 32 includes opposed walls 54, 56 shown best in FIG. 6 which diverge or taper outwardly in a manner which enables the solid/gas mixture to flow outwardly therefrom at a sufficient speed and force to remove small particles from the substrate without damaging the substrate.

Figure 7:
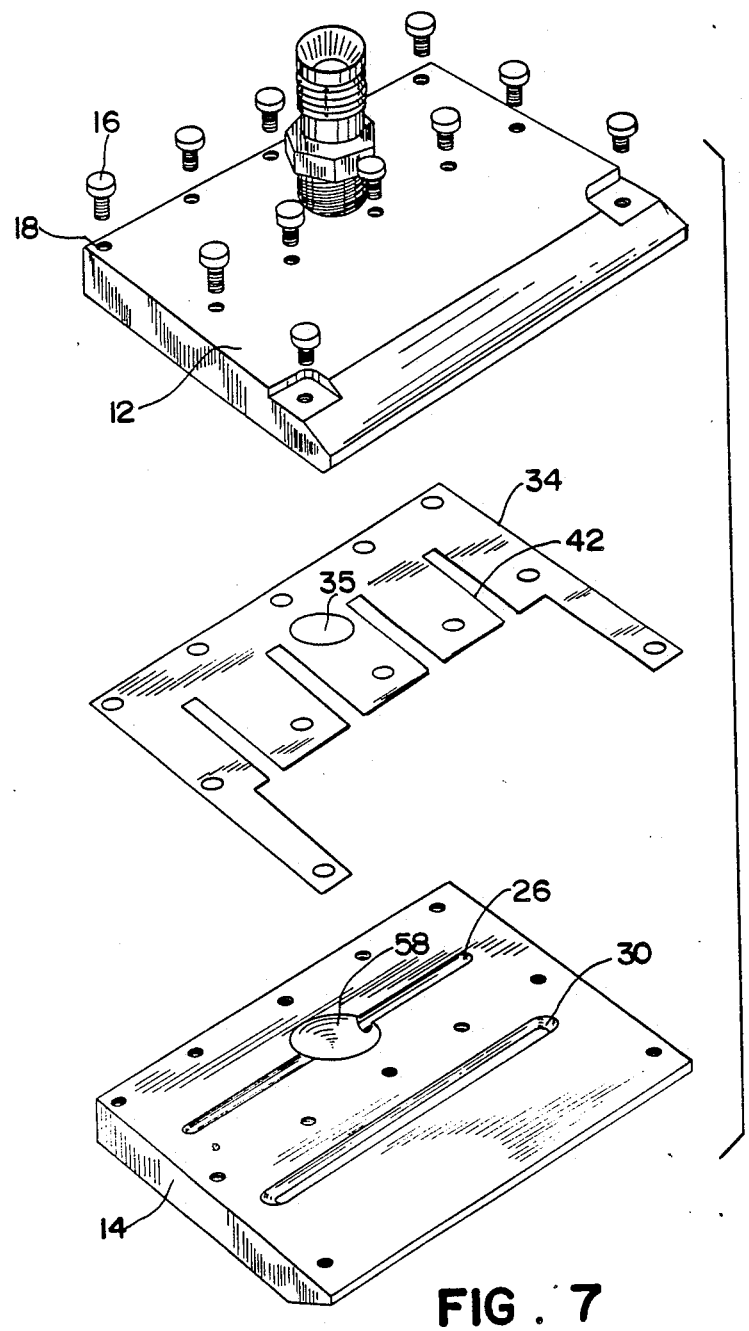
FIG. 7 is an elevational view of another embodiment of the invention showing a fluid receiving reservoir in the middle of the first chamber.

As shown in FIG. 7, the transverse groove 26 may be provided with an enlarged area or reservoir 58 which is aligned with and of the same cross-sectional area as the hole 10 of the receiving assembly 4. This embodiment enables a larger volume of fluid to be supplied to the first chamber than the specific embodiment shown in FIG. 4.

The source of carbon dioxide utilized in this invention is a fluid source which is stored at a temperature and pressure above what is known as the "triple point" which is that point where either a liquid or a gas will turn to a solid upon removal of heat. It will be appreciated that, unless the fluid carbon dioxide is above the triple point, it will not pass the orifice of the apparatus of this invention.

The source of carbon dioxide contemplated herein is in a fluid state, i.e. liquid, gaseous or a mixture thereof, at a pressure of at least the freezing point pressure, or about 65 psia and, preferably, at least about 300 psia. The fluid carbon dioxide must be under sufficient pressure to control the flow through the first chamber and into the second chamber formed by grooves 28 and 30. Typically, the fluid carbon dioxide is stored at ambient temperature at a pressure of from about 300 to 1000 psia, preferably at about 750 psia. It is necessary that the enthalpy of the fluid carbon dioxide feed stream under the above pressures be below about 135 BTU per pound, based on an enthalpy of zero at 150 psia for a saturated liquid. The enthalpy requirement is essential regardless of whether the fluid carbon dioxide is in a liquid, gaseous or, more commonly, a mixture, which typically is predominantly liquid. If the subject apparatus is formed of a suitable metal, such as steel or tungsten carbide, the enthalpy of the store fluid carbon dioxide can be from about 20 to 135 BTU/lb. In the event the subject apparatus is constructed of a resinous material such as, for example, high-impact polypropylene, the enthalpy can be from about 110 to 135 BTU/lb. These values hold true regardless of the ratio of liquid and gas in the fluid carbon dioxide source.

The film like member 34 has at least one channel 42, preferably at least two channels and most preferably the number of channels selected is dependent on the width of the channels. That is, the total width of the channels (i.e. the sum of the distances "x") must be at least about 10% of the total width of the ejection port 32 as shown in FIG. 1 as the distance "y". The preferred total channel width is in the range of from about 10 to 20% of the width of the ejection port 32.

The selection of the number of channels is in part determined by manufacturing considerations in that the greater the number of fingers 40, the greater the likelihood that the thin fingers will not lie perfectly flat in the assembled apparatus. On the other hand, the lower the number of channels, the less control over the distribution of the carbon dioxide as it passes from the first to the second chamber.

The thickness of the film like member 34 is likewise dependent on manufacturing considerations as well as flow control. For practical purposes, it is difficult to manufacture the film below 0.001". While there is no particularly desirable upper range, about 0.001 to 0.020" has been found to be a suitable thickness for the film 34. It is also desirable to make the film 34 of a flexible material to insure flat face-to-face contact with the plate surfaces when the plates are secured to each other.

The transverse grooves 26, 28 and 30 and, optionally 24, are preferably equidimensional having a length and cross-sectional area dependent on the like dimensions of the ejection port 32. The length of the grooves 28 and 30 is about equal to the width of the ejection port 32. The length of the transverse grooves 24 and 26 is at least sufficient to reach the outermost channels 42. The cross-sectional area of the chambers should be sufficient to maintain the pressure in the second chamber in the range of from about 80 to 160 psia, preferably about 100 psia.

In operation, the fluid carbon dioxide exits a storage tank or other source of carbon dioxide and proceeds through the connecting means 6 to the receiving assembly 4 and flows through the hole 10, the corresponding hole 35 in the film-like member 34 and the hole 33 in the top plate 12 where it then enters the chamber formed by groove 24 alone or optionally by grooves 24 and 26. The fluid carbon dioxide then flows out of the first chamber through the ends 44 of the channels 42 formed by fingers 40.

As the fluid carbon dioxide flows out of the first chamber it expands along a constant enthalpy line to about 80–100 psia as it enters the coalescing chamber formed by grooves 28 and 30. As a result, a portion of the fluid carbon dioxide is converted to fine droplets. It will be appreciated that the state of the fluid carbon dioxide feed will determine the degree of change that takes place in the coalescing chamber, e.g. saturated gas or pure liquid carbon dioxide in the source container will undergo a proportionately greater change than liquid/gas mixtures. The equilibrium temperature in the second chamber is typically about $-57°$ F. and, if the source is room temperature liquid carbon dioxide, the carbon dioxide in second chamber is formed into a mixture of about 50% fine liquid droplets and 50% carbon dioxide vapor.

The fine liquid droplet/gas mixture continues to flow through the second chamber. As a result of additional exposure to the pressure drop, the fine liquid droplets coalesce into larger liquid droplets. The larger liquid droplets/gas mixture forms into a solid/gas mixture as the feed proceeds through the orifice 52 and out the ejection port 32.

Walls 54, 56 forming the ejection port 32 are suitably tapered at an angle of divergence of about 4° to 8°, preferably about 6°. If the angle of divergence is too great (i.e. above about 15°), the intensity of the stream of solid/gas carbon dioxide will be reduced below that which is necessary to clean most substrates.

The second chamber serves to coalesce the fine liquid droplets into larger liquid droplets. The larger liquid droplets form minute, solid carbon dioxide particles as the carbon dioxide expands and exits toward the substrate at the ejection port 32. In accordance with the present invention, the solid/gaseous carbon dioxide having the requisite enthalpy as described above, is subjected to desired pressure drops from the first chamber through the channels 42 into the second chamber, the orifice 52 and ejection port 32.

Although the present embodiments incorporate two stages of expansion, those skilled in the art will recognize that nozzles having three or more stages of expansion may also be used, with three or more sets of transverse grooves.

Pure carbon dioxide may be acceptable for many applications using the present invention, for example, in the field of optics, including the cleaning of telescope mirrors. For certain applications, however, ultrapure carbon dioxide (99.99% or higher) may be required, it being understood that purity is to be interpreted with respect to undesirable compounds for a particular application. For example, mercaptans may be on the list of impurities for a given application whereas nitrogen may be present. Applications that require ultrapure carbon dioxide include the cleaning of silicon wafers for semiconductor fabrication, disc drives, hybrid circuit assemblies and compact discs.

For applications requiring ultrapure carbon dioxide, it has been found that usual nozzle materials are unsatisfactory due to the generation of particulate contamination. Specifically, stainless steel may generate particles of steel, and nickel coated brass may generate nickel. To eliminate undesirable particle generation in the area of the orifices, the following materials are preferred: sapphire, fused silica, quartz, tungsten carbide, and poly(-tetrafluoroethylene). The subject nozzle may consist entirely of these materials or may have a coating thereof.

The invention can effectively remove particles, hydrocarbon films particles embedded in oil and fingerprints. Applications include, but are not limited to the cleaning of optical apparatus, space craft, semiconductor wafers, and equipment for contaminant-free manufacturing processes.

EXAMPLE

A cylinder of Airco Spectra Clean carbon dioxide equipped for liquid withdrawal was connected via a four foot length of ⅛ inch O.D. stainless steel tubing to the inlet fitting of a nozzle of the type shown in FIGS. 4 and 5A. The nozzle was made of Type 316 stainless steel having an overall width of 2½ inches and an outlet aperture of 2 inches.

The distance between the first chamber and the second chamber (i.e. the length of the metering channels 42) was ⅝ inch. The length of the second orifice extending from the coalescing chamber to the beginning of the divergent walls 54, 56 of the ejection port 32 was 9/16 inch. The walls 54, 56 were tapered at angle 6° thereby providing an expansion ratio of 4:1.

The film-like elements employed in the respective nozzles each had a thickness of 0.001 inch and included four metering channels 42. The channels 42 of the respective film-like members 34 were 0.40, 0.60 and 0.80 inch, respectively.

The substrate to be cleaned was a silicon wafer which was artificially contaminated with zinc sulfide powder dispersed in ethyl alcohol.

The nozzle was operated in free air for about 5 seconds to cool down and establish stable flow of the product mixture. Then the nozzle was moved to a position of 45° with respect the substrate surface at a distance of about ¾ inch.

Liquid carbon dioxide from the cylinder was supplied to the nozzle at a pressure of 850 psia. The 0.040 inch wide nozzle produced a flow rate of only 2 scfm and a coalescing chamber pressure of less than 80 psia. As a result, the solid carbon dioxide particles produced were too big and moved at too slow a velocity to remove the zinc sulfide particles from the substrate.

Both the 0.060 and 0.080 inch wide nozzles were effective in removing the contaminated particles as they produced a smooth stable flow of solid carbon dioxide particles at a flow rate of 3.4 scfm and 4.7 scfm, respectively. The substrate was examined under ultraviolet light which causes the contaminants to fluoresce. No trace of the contaminants was present on the substrates.

While the present invention has been particularly described in terms of specific embodiments thereof, it will be understood that numerous variations of the invention are within the skill in the art, which variations are yet within the instant teachings. For example, radial inflow or outflow nozzles may be constructed to respectively clean the outside or inside surfaces of tubular structure nozzles having conical inflow and outflow passages may be constructed for the same purpose. Accordingly, the present invention is to be broadly construed and limited only by the scope and the spirit of the claims appended hereto.

What is claimed is:

1. Apparatus for removing small particles from a substrate comprising:
    (a) a source of fluid carbon dioxide under pressure and having an enthalpy below about 135 BTU per pound based on an enthalpy of 0 at 150 psia for a saturated liquid, so that a solid fraction will form upon the expansion of the fluid carbon dioxide to the ambient pressure of the substrate;
    (b) a nozzle having a first opening for receiving the fluid carbon dioxide from the source and a second opening for emitting a mixture of solid and gaseous carbon dioxide toward the substrate, said nozzle further comprising, said
        (1) a pair of plates adapted to be superimposed over each other collectively defining a first chamber connected to the first opening and a second chamber spaced apart from the first chamber;
        (2) a foil-like member interposed between the superimposed plates comprising a hole aligned with the first opening for providing a pathway for the flow of fluid into the first chamber, and at least two finger-like projections extending from the first chamber to the second chamber and together with the superimposed plates forming at least one first channel providing flow communication between the first and second chambers, wherein the at least one first channel is sized to form a restriction such that the fluid forms a first mixture of gaseous carbon dioxide and fine droplets of liquid carbon dioxide in the at least one first channel and wherein the first mixture is converted in the second chamber to a second mixture containing gaseous carbon dioxide and large liquid droplets of carbon dioxide; and
        (3) a second channel extending from the second chamber to the second opening enabling the second mixture to expand into said mixture of solid and gaseous carbon dioxide and exit out of the second opening toward the substrate.

2. The apparatus of claim 1 wherein the second chamber comprises substantially parallel superimposed transverse grooves extending along a substantial width of the plates.

3. The apparatus of claim 2 wherein the first chamber comprises a transverse groove on one plate and a flat surface portion of the other plate superimposed over said transverse groove.

4. The apparatus of claim 2 wherein the first chamber comprises substantially parallel superimposed transverse grooves extending along a substantial width of the plates.

5. The apparatus of claim 2 wherein the length of the second chamber is about equal to the width of the second opening.

6. The apparatus of claim 1 wherein the sum of the widths of the first channels is at least about 10% of the width of the second opening.

7. The apparatus of claim 6 wherein the sum of the widths of the first channels is from about 10 to 20% of the width of the second opening.

8. The apparatus of claim 1 comprising a plurality of first channels.

9. The apparatus of claim 1 wherein the second opening comprises divergently tapered walls having an angle of divergence of up to 15°.

10. The apparatus of claim 2 wherein the angle of divergence is about 4° to 8°.

11. The apparatus of claim 1 wherein the width of the foil-like member is at least about 0.001 inch.

12. The apparatus of claim 11 wherein the width of the foil-like member is from about 0.001" to 0.020 inch.

13. The apparatus of claim 1 further comprising means for maintaining the pressure in the second chamber from about 80 to 160 psia.

14. The apparatus of claim 1 further comprising means for maintaining said plates in said superimposed position.

15. Apparatus for removing small particles from a substrate comprising:
    (a) a source of fluid carbon dioxide under pressure and having an enthalpy of below about 135 BTU per pound based on an enthalpy of zero at 150 psia for a saturated liquid, so that a solid fraction will form upon the expansion of the fluid carbon dioxide to the ambient pressure of the substrate;
    (b) a nozzle having a first opening for receiving the fluid carbon dioxide from the source and a second opening having tapered walls diverging at an angle of up to 15° for emitting a mixture of solid and gaseous carbon dioxide toward the substrate, said nozzle further comprising,
        (1) a pair of plates adapted to be superimposed over each other collectively defining a first chamber connected to the first opening and having complimentary transverse grooves which when superimposed define a second chamber spaced apart from the first chamber, said first and second chambers having a length of from 20 to 60% of the overall width of the plates;
        (2) a foil-like member interposed between the superimposed plates and comprising a hole aligned with the first opening for providing a pathway for the flow of said fluid into the first chamber, and at least three finger-like projections extending from the first chamber to the second chamber and together with the superimposed plates forming at least two first channels having a combined width of the second opening and providing flow communication between the first and second chambers, wherein each of the at least two first channels are sized to form a restriction such that the fluid forms a first mixture of gaseous carbon dioxide and fine droplets of liquid carbon dioxide in the at least two first channels and wherein the first mixture is converted in the second chamber to a second mixture containing gaseous carbon dioxide and larger liquid droplets of carbon dioxide; and (3) a second channel extending from the second chamber to the second opening enabling the second mixture to expand into said mixture of solid and gaseous carbon dioxide and exit out of the second opening toward the substrate.

16. The apparatus of claim 15 wherein the sum of the widths of the first channels is from about 10 to 20% of the width of the second opening.

17. The apparatus of claim 15 wherein the second opening comprises divergently tapered walls having an angle of divergence of 4 to 8°.

18. The apparatus of claim 15 wherein the thickness of the foil-like member is at least 0.001 inch.

19. The apparatus of claim 15 further comprising means for maintaining the pressure in the second chamber from about 80 to 160 psia.

20. The apparatus of claim 15 further comprising means for maintaining said plates in said superimposed position.

* * * * *

UNITED STATES PATENT AND TRADEMARK OFFICE
CERTIFICATE OF CORRECTION

| | |
|---|---|
| PATENT NO. : | 4,962,891 |
| DATED : | October 16, 1990 |
| INVENTOR(S) : | Lawrence M. Layden |

It is certified that error appears in the above—identified patent and that said Letters Patent is hereby corrected as shown below:

Col. 2, delete lines 4 through 13 and substitute therefor:

--flow of said fluid into the first chamber and at least two finger-like projections extending from the first chamber to the second chamber and together with the superimposed plates forming at least one first channel providing flow communication between the first and second chambers, wherein the fluid forms a first mixture of gaseous carbon dioxide and fine droplets of liquid carbon dioxide in the at least one first channel and wherein the first mixture is--

Signed and Sealed this

Twelfth Day of October, 1993

*Attest:*

BRUCE LEHMAN

*Attesting Officer*      *Commissioner of Patents and Trademarks*